United States Patent
Kim et al.

(10) Patent No.: US 9,831,022 B2
(45) Date of Patent: Nov. 28, 2017

(54) MAGNETIC SHEET AND WIRELESSLY CHARGED MAGNETIC MEMBER INCLUDING SAME

(71) Applicant: LG INNOTEK CO. LTD., Seoul (KR)

(72) Inventors: So Yeon Kim, Seoul (KR); Seok Bae, Seoul (KR); Soon Young Hyun, Seoul (KR); Jai Hoon Yeom, Seoul (KR); Sang Won Lee, Seoul (KR); Hee Jung Lee, Seoul (KR); Don Chul Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/028,174

(22) PCT Filed: Oct. 8, 2014

(86) PCT No.: PCT/KR2014/009461
§ 371 (c)(1),
(2) Date: Apr. 8, 2016

(87) PCT Pub. No.: WO2015/053548
PCT Pub. Date: Apr. 16, 2015

(65) Prior Publication Data
US 2016/0268033 A1   Sep. 15, 2016

(30) Foreign Application Priority Data
Oct. 8, 2013   (KR) .................. 10-2013-0119701

(51) Int. Cl.
*H01F 10/00*   (2006.01)
*H02J 17/00*   (2006.01)
(Continued)

(52) U.S. Cl.
CPC ............ *H01F 10/007* (2013.01); *B32B 5/16* (2013.01); *H01F 1/0027* (2013.01);
(Continued)

(58) Field of Classification Search
None
See application file for complete search history.

(56) References Cited

U.S. PATENT DOCUMENTS 5,378,496 A * 1/1995 Kashiwaya ........... C23C 14/225
427/128
7,405,709 B2 * 7/2008 Takahashi ................ H01Q 1/38
343/788
(Continued)

FOREIGN PATENT DOCUMENTS

JP    05314466 A  * 11/1993
JP    11126331 A  *  5/1999
(Continued)

OTHER PUBLICATIONS

Derwent Abstract of JP 05-314466 A (pub. 1993).*
(Continued)

*Primary Examiner* — Kevin Bernatz
(74) *Attorney, Agent, or Firm* — Saliwanchik, Lloyd & Esenschenk

(57) ABSTRACT

An embodiment of the present invention relates to a magnetic sheet having both an electromagnetic field shielding function and a heat dissipating function, and to a wirelessly charged magnetic member using same.

10 Claims, 2 Drawing Sheets

(51) Int. Cl.
  *H05K 9/00* (2006.01)
  *B32B 5/16* (2006.01)
  *H01F 1/147* (2006.01)
  *H01F 1/00* (2006.01)
  *H01M 10/44* (2006.01)

(52) U.S. Cl.
  CPC ..... *H01F 1/14716* (2013.01); *H01F 1/14733* (2013.01); *H02J 17/00* (2013.01); *H05K 9/0075* (2013.01); *B32B 2260/046* (2013.01); *B32B 2264/105* (2013.01); *B32B 2307/208* (2013.01); *B32B 2457/00* (2013.01); *H01F 1/14775* (2013.01); *H01F 1/14791* (2013.01); *H01M 10/44* (2013.01); *H01M 2220/30* (2013.01)

(56) References Cited

U.S. PATENT DOCUMENTS

| | | | | |
|---|---|---|---|---|
| 8,888,008 | B2* | 11/2014 | Teshima | G06K 19/0723 235/492 |
| 2001/0020054 | A1* | 9/2001 | Toyoda | H01Q 17/004 523/137 |
| 2003/0010408 | A1* | 1/2003 | Hosoe | H01Q 17/004 148/310 |
| 2006/0198998 | A1* | 9/2006 | Raksha | G02B 5/09 428/323 |
| 2007/0252771 | A1* | 11/2007 | Maezawa | G06K 19/07771 343/841 |
| 2009/0226696 | A1* | 9/2009 | Simpson | C08J 9/0066 428/304.4 |
| 2011/0210696 | A1* | 9/2011 | Inoue | H01F 27/365 320/108 |
| 2013/0126622 | A1* | 5/2013 | Finn | G06K 19/07771 235/492 |
| 2013/0147675 | A1* | 6/2013 | Kato | H01Q 1/38 343/788 |
| 2013/0249662 | A1* | 9/2013 | Tonoyama | H01F 27/255 336/200 |
| 2013/0320024 | A1* | 12/2013 | Perillon | A47J 36/02 220/573.2 |
| 2014/0091758 | A1* | 4/2014 | Hidaka | H01F 38/14 320/108 |
| 2014/0176282 | A1* | 6/2014 | Jung | H01F 27/2804 336/200 |
| 2014/0352382 | A1* | 12/2014 | Wang | B41F 5/24 72/54 |
| 2015/0123604 | A1* | 5/2015 | Lee | H01F 38/14 320/108 |
| 2015/0249282 | A1* | 9/2015 | Orihara | H01Q 1/243 343/702 |
| 2016/0104937 | A1* | 4/2016 | Kumura | H01Q 1/2208 343/788 |
| 2016/0205228 | A1* | 7/2016 | Orihara | H04M 1/026 455/575.7 |

FOREIGN PATENT DOCUMENTS

| | | | |
|---|---|---|---|
| JP | 2003142871 A | * | 5/2003 |
| JP | 2003142871 A | | 5/2003 |
| JP | 2004247663 A | * | 9/2004 |
| JP | 2004247663 A | | 9/2004 |
| JP | 2007281074 A | | 10/2007 |
| JP | 2008008962 A | * | 1/2008 |
| JP | 2008008962 A | | 1/2008 |
| JP | 2012253247 A | * | 12/2012 |
| JP | 2012253247 A | | 12/2012 |

OTHER PUBLICATIONS

Machine Translation of JP 05-314466 A (pub. 1993).*
Machine Translation of JP 2007-281074 A (pub. 2007).*
Derwent Abstract of JP 2012253247 A (pub. 2012).*
Derwent Abstract of JP 2008-008962 A (pub. 2008).*
Derwent Abstract of JP 2004-247663 A (pub. 2004).*
Derwent Abstract of JP 2003-142871 A (pub. 2003).*
Derwent Abstract of JP 11-126331 A (pub. 1999).*
International Search Report in International Application No. PCT/KR2014/009461, filed Oct. 8, 2014.

* cited by examiner

MAGNETIC SHEET AND WIRELESSLY CHARGED MAGNETIC MEMBER INCLUDING SAME

CROSS-REFERENCE TO RELATED APPLICATION

This application is the U.S. national stage application of International Patent Application No. PCT/KR2014/009461, filed Oct. 8, 2014, which claims priority to Korean Application No. 10-2013-0119701, filed Oct. 8, 2013, the disclosures of each of which are incorporated herein by reference in their entirety.

TECHNICAL FIELD

The present invention relates to a magnetic sheet having both an electromagnetic field shielding function and a heat dissipating function, and to a wirelessly charged magnetic member using same.

BACKGROUND ART

Methods of charging a secondary battery installed in an electronic device such as a portable terminal, a video camera or the like are divided into two types of charging methods, that is, a contact-type charging method and a non-contact-type (wireless) charging method. The contact-type charging method is a method in which a battery is charged by bringing an electrode of a power transmission device into contact with an electrode of a power reception device.

The contact-type charging method has been generally used in a wide range of applications since a device used in the method has a simple structure. However, as a variety of small-sized and lightweight electronic devices are manufactured to reduce the weight of the electronic devices, poor charging (a charging error) may be caused due to the lack of a contact pressure between the electrode of the power reception device and the electrode of the power transmission device. Also, it is necessary to prevent an increase in temperature of a secondary battery since the secondary battery is vulnerable to heat. Also, attention should be paid to a circuit design to prevent overcharging and over-discharging. To cope with such problems, the non-contact-type (wireless) charging method is now under consideration.

In the case of the non-contact-type (wireless) charging method, a structure in which coupling is reinforced using a planar coil and a magnetic sheet has been proposed to manufacture the small-sized and lightweight electronic devices. However, such a non-contact-type (wireless) charging method has a problem in that heat is generated in the devices due to an eddy current caused by electromagnetic induction. As a result, a large amount of power cannot be transmitted, resulting in a long charging time.

In particular, there is need for development of a magnetic sheet material to solve the above-described problems regarding the heat generation when applied to such a wireless charging method, thereby enhancing thermal conductivity of the magnetic sheet material itself.

DISCLOSURE

Technical Problem

The present invention is directed to providing a magnetic sheet having both an electromagnetic field shielding function and a heat dissipating function, and a wirelessly charged magnetic member including same. Here, the magnetic sheet is formed by forming a thin film from a base substrate composition which includes a binder resin and a plurality of particles of a magnetic powder which has a width-direction length (X) longer than a thickness-direction length (Y), wherein a proportion of the particles of the magnetic powder, in which an angle (θ) formed between an extension line of cross section of each of the particles of the magnetic powder in a horizontal direction and an extension line of a horizontal plane of the base substrate in the base substrate is an acute angle, an obtuse angle or a straight angle, with respect to the total number of the particles of the magnetic powder is in a range of 30%~99%.

Technical Solution

One aspect of the present invention provides a magnetic sheet formed by forming a thin film from a base substrate composition which includes a binder resin and a plurality of particles of a magnetic powder which has a width-direction length (X) longer than a thickness-direction length (Y), wherein a proportion of the particles of the magnetic powder, in which an angle (θ) formed between an extension line of cross section of each of the particles of the magnetic powder in a horizontal direction and an extension line of a horizontal plane of the base substrate in the base substrate is an acute angle, an obtuse angle or a straight angle, with respect to the total number of the particles of the magnetic powder is in a range of 30%~99%.

Another aspect of the present invention provides a wirelessly charged magnetic member in which the two or more magnetic sheets are stacked.

Advantageous Effects

The exemplary embodiments implement the magnetic sheet which is formed by forming a thin film from a base substrate composition which includes a binder resin and a plurality of particles of a magnetic powder which has a width-direction length (X) longer than a thickness-direction length (Y), wherein a proportion of the particles of the magnetic powder, in which an angle (θ) formed between an extension line of cross section of each of the particles of the magnetic powder in a horizontal direction and an extension line of a horizontal plane of the base substrate in the base substrate is an acute angle, an obtuse angle or a straight angle, with respect to the total number of the particles of the magnetic powder is in a range of 30%~99%, and the magnetic sheet having both an electromagnetic field shielding function and a heat dissipating function can also be very effectively applied to wireless charging products.

SEQUENCE LIST TEXT

Figure 1:
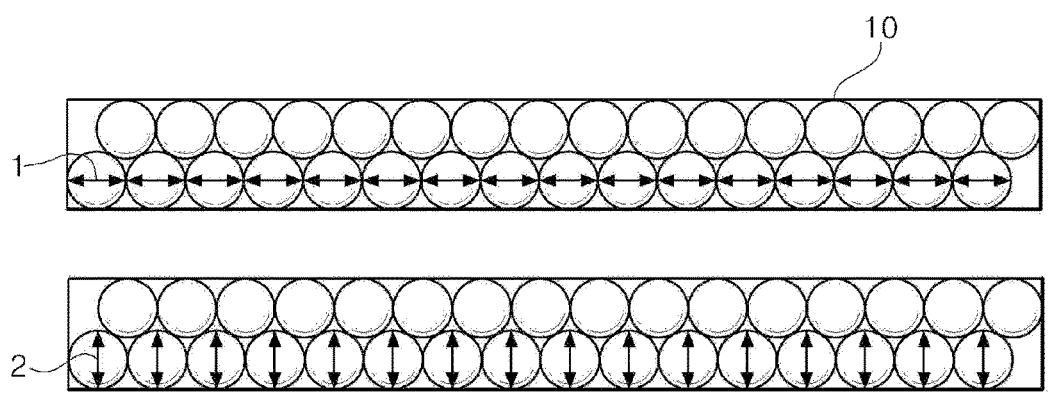
FIG. 1 is a diagram showing a configuration of conventional magnetic powder particles in a magnetic sheet.

1: width-direction length of conventional magnetic powder

2: thickness-direction length of conventional magnetic powder

3, X: width-direction length of magnetic powder according to an exemplary embodiment.

4, Y: thickness-direction length of magnetic powder according to an exemplary embodiment.

10: magnetic powder particle

100: base substrate p: line of a horizontal direction (horizontal plane)

(a), (d): acute angle (angle formed between horizontal plane and magnetic powder)

(b): straight angle (angle formed between horizontal plane and magnetic powder)

(c): obtuse angle (angle formed between horizontal plane and magnetic powder)

MODES OF THE INVENTION

Hereinafter, exemplary embodiments of the present invention which those skilled in the art easily carry out will be described in detail with reference to the drawings. However, the configuration shown in the embodiment and drawings set forth herein should be understood that merely only a exemplary embodiment of the present invention, for transformation and various equivalents can be made at the time when the present application is applied. Also, when a detailed description of the known functions relating to in detail in the following description of the operation principle of a preferred embodiment of the invention, or configuration determines may unnecessarily obscure the subject matter of the present invention, a detailed description thereof will be omitted. Terms are described below as a term defined according to the functions of the present invention, the meanings of the terms should be construed based on the contents throughout the specification. For the part to a similar function and operation throughout the drawings, the same reference numerals.

FIG. 1 is a concept diagram showing an arrangement pattern of a magnetic powder which may be included in a conventional magnetic sheet or magnetic film.

In general, the magnetic powder included in a member in the form of a sheet or a film is configured so that a particle structure including uniform particles or non-uniform particles is included in the sheet, as shown in FIG. 1. Each particle of the magnetic powder is generally configured to have a diameter 1 in a width direction of the sheet and a diameter 2 in a thickness direction of the magnetic sheet. In the case of a magnetic sheet having a general arrangement of such magnetic powder, differences in shape and layout density are not significant when the diameter 1 of the magnetic sheet in the width direction and the diameter 2 of the sheet in the thickness direction are laid out. In general, the magnetic sheet has a thermal conductivity in a width direction lower than a thermal conductivity in a thickness direction, resulting in degraded heat dissipating characteristics.

Figure 2:
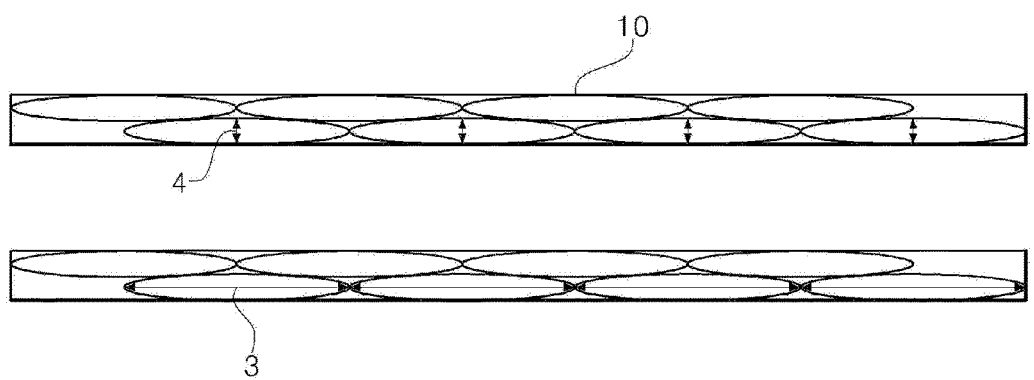
FIG. 2 is a diagram showing a configuration of magnetic powder particles according to an exemplary embodiment.

Therefore, according to an exemplary embodiment of the present invention, when particles of magnetic powder 10 are arranged in a base substrate by applying a structure obtained by flaking the magnetic powder included in the base substrate, as shown in FIG. 2, characteristics such as thermal conductivity of the base substrate 100 in a horizontal direction (a width direction; 3) may be improved. At the same time, a magnetic sheet having a structure capable of improving an electromagnetic field shielding function may be realized.

Figure 3:
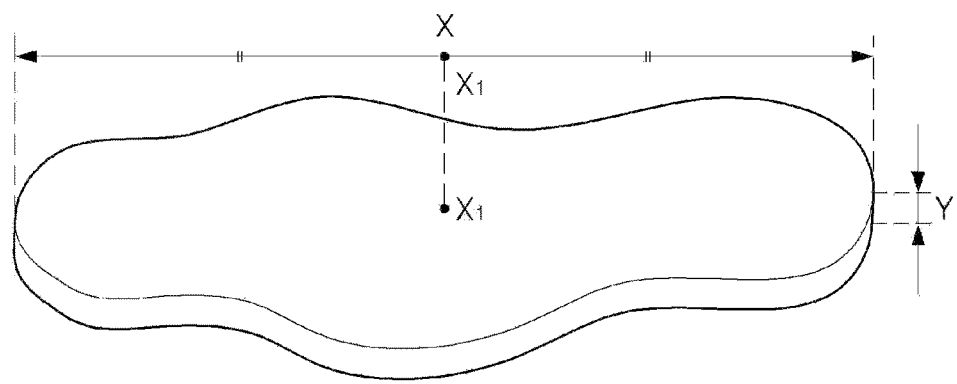
FIG. 3 is a diagram showing a particle shape of the magnetic powder according to the exemplary embodiment.

FIG. 3 is a concept diagram for conceptualizing a structure of magnetic powder particles according to an exemplary embodiment of the present invention.

As shown in FIG. 3, the particles of the magnetic powder according to an exemplary embodiment of the present invention are characterized by having a flake structure in which a horizontal section forms a simple closed curve, rather than a spherical shape such as the particle structure of a conventional magnetic powder. According to the exemplary embodiment of the present invention, the flake structure is defined as a three-dimensional structure in which the maximum length of a particle of the magnetic powder in a horizontal direction is greater than a thickness of the particle of the magnetic powder, as viewed from a horizontal cross section of the magnetic powder as shown in FIG. 3.

As shown in FIG. 3, the exemplary embodiment of the magnetic sheet having a base substrate, which is a kind of sheet of film, including the particles of magnetic powder having a flake structure included in the base substrate, a binder resin and a plurality of particles of magnetic powder included in the base substrate, wherein the particles of the magnetic powder form the magnetic sheet which has a width-direction length X of the base substrate greater than a thickness-direction length Y. The magnetic sheet according to this exemplary embodiment may have an improved thermal conductivity in a width direction by orienting the lamellar particles of the magnetic powder in a horizontal direction, and may also have both an electromagnetic field shielding function and a heat dissipating function. (The width-direction length X is the longest horizontal line segment in a cross section of each of the particles of the magnetic powder in a horizontal direction, and the thickness-direction length Y is the longest vertical line segment in a cross section of each the particles of the magnetic powder in a vertical direction.)

According to the exemplary embodiment of the present invention, when the particles of the magnetic powder are arranged in a base substrate, the particles of the magnetic powder tend to have a strong orientation in which the particles of the magnetic powder have a width-direction length X longer than a thickness-direction length Y. Therefore, an occupation ratio (%) of the particles of a metal powder in a plane in a width direction may be increased when compared to a thickness direction, thereby enhancing thermal conductivity Ta in the width direction.

Figure 4:
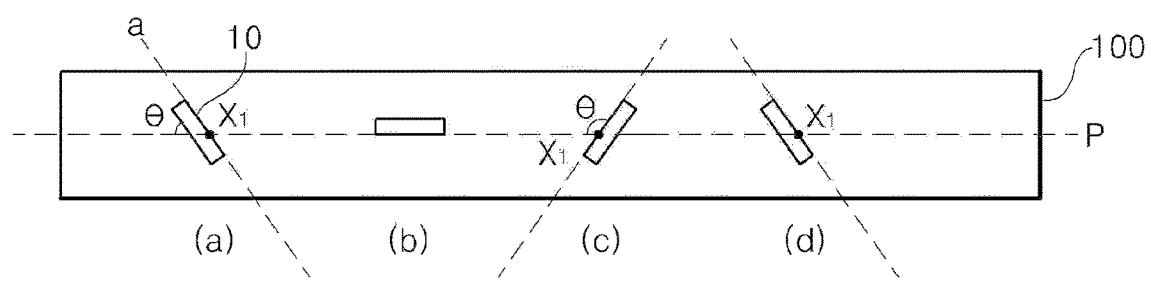
FIG. 4 is a diagram showing an orientation of a particle of the magnetic powder according to the exemplary embodiment.

FIG. 4 is a concept diagram for describing an orientation in which the particles of the magnetic powder 10 according to one exemplary embodiment of the present invention are arranged in the base substrate 100.

As shown in FIG. 4, the plurality of flaked particles of the magnetic powder 10 according to the exemplary embodiment of the present invention may be arranged inside the base substrate 100. In this case, when it is assumed that there is an imaginary line segment P of the base substrate 100 in a horizontal direction (hereinafter, referred to as 'horizontal plane' of the base substrate), an extension line of a cross section of a particle of the magnetic powder 10 in a horizontal direction and an extension line of a horizontal plane of the base substrate form an angle. The particles of the magnetic powder in which the angle is an acute angle, an obtuse angle, or a straight angle may be formed at a content of 30%~99% of the total number of particles of the magnetic powder. In particular, the particles of the magnetic powder, which satisfy that an angle (θ) formed between an extension line of a horizontal line segment of the magnetic powder in a width direction and an extension line of a horizontal plane P of a particle of the magnetic powder is in a range of 30°~60° at a central point X1 that becomes the center of the width-direction length X of the particle of the magnetic powder shown in FIG. 3, are preferably formed to be included at 30%~99% of the total number of particles of the magnetic powder.

As shown in (a) of FIG. 4, the angle formed between a particle of the magnetic powder 10 having a flake structure and the horizontal plane of the base substrate 100 may be an acute angle, or as shown in (b) of FIG. 4, a straight angle, or as shown in (c) of FIG. 4, an obtuse angle. Thermal conductivity may be improved as the particles of the magnetic powder 10 are oriented at an angle close to horizontal. When the particles of the magnetic powder oriented at an angle close to horizontal are formed to be included at 30%~99% of the total number of particles of the magnetic powder, the base substrate of the present invention may have an ensured effect of improving characteristics such as thermal conductivity in a horizontal direction. When the particles of the magnetic powder oriented at an angle close to horizontal are formed to be included less than 30%, there is no big difference in the structure of the conventional magnetic flake.

Also, the particles of the magnetic powder may satisfy that the width-direction length X:the thickness-direction length Y is in a range of (3~80):1. When the width-direction length X:the thickness-direction length Y is less than 3:1, there is a slight difference in lengths of the particles of the magnetic powder 10 in the width direction and the thickness direction, the results of which are close to those of the prior-art particles of magnetic powder, and it is difficult to expect the magnetic powder to have high thermal stability in a width direction due to a low occupation ratio (%) of the particles of the magnetic powder in the width direction. On the other hand, when the width-direction length X:the thickness-direction length Y is greater than 80:1, it may be difficult to form a lamellar magnetic sheet due to a very long length in the width direction.

Also, the particles of the magnetic powder may have a width-direction length X of 10 to 100 μm. When the width-direction length of the particles of the magnetic powder is less than 10 μm, there is a slight differences in length of the particles of the magnetic powder in the width direction and the thickness direction, the results of which are close to those of the prior-art particles of magnetic powder, and it is difficult to expect the particles of the magnetic powder to have high thermal stability in a width direction due to a low occupation ratio (%) of the particles of the magnetic powder in the width direction. On the other hand, when the width-direction length is greater than 100 μm, it may be difficult to form a lamellar magnetic sheet due to a very long length in the width direction.

The particles of the magnetic powder may have a thickness-direction length Y of 0.4 μm to 1.5 μm. When the thickness-direction length Y of the particles of the magnetic powder decreases, the ratio of the width-direction length X and the thickness-direction length Y increases, and the occupation ratio (%) of the metal powder in a plane in a width direction is larger than the occupation ratio (%) of the metal powder in the plane in a thickness direction, thereby improving thermal conductivity Ta in the width direction.

The plurality of particles of the magnetic powder in the base substrate may have an apparent density preferably satisfying a range of 0.2~0.8 g/cm$^3$. As the density decreases, a specific surface area increases, and thus, thermal conductivity is enhanced, resulting in increased thermal conductivity Ta in the width direction. When the density is out of this range, the thermal conductivity in the width direction increases, resulting in degraded magnetization characteristics of a magnetic sheet.

The particles of the magnetic powder may have a particle size of 50 μm to 80 μm. When the particle size of the magnetic powder is less than 50 μm, it is difficult to uniformly mix the particles of the magnetic powder with a binder resin, which makes it difficult to realize a uniform distribution of the particles of the magnetic powder. When the particle size of the magnetic powder is greater than 80 μm, it may be difficult to form a thin magnetic sheet. Therefore, the particle size of the magnetic powder may be selected within this range.

The base substrate has a thermal conductivity Ta in the width direction higher than the thermal conductivity Tb in the thickness direction, and thus the ratio (Ta:Tb) of the thermal conductivity Ta in the width direction and the thermal conductivity Tb in the thickness direction may be in a range of (5~15):1, but the present invention is not particularly limited thereto. When the ratio (Ta:Tb) of the thermal conductivity Ta in the width direction and the thermal conductivity Tb in the thickness direction is less than 5:1, it is difficult to expect the particles of the magnetic powder to have high thermal stability in the width direction due to a low occupation ratio (%) of the particles of the magnetic powder in the width direction, and it may also be difficult for the particles of the magnetic powder to have both an electromagnetic field shielding function and a heat dissipating function.

Alose, the thermal conductivity Ta in a width direction may be 3 W/m·k to 10 W/m·k. When the thermal conductivity Ta in the width direction is less than 3 W/m·k, it is difficult to expect the particles of the magnetic powder to have high thermal stability in the width direction due to a low occupation ratio (%) of the particles of the magnetic powder in the width direction, and it may also be difficult for the particles of the magnetic powder to have both an electromagnetic field shielding function and a heat dissipating function.

The magnetic powder may be a metal-based magnetic powder. The magnetic powder 10 includes at least one Fe-based alloy selected from the group consisting of iron (Fe), nickel (Ni), cobalt (Co), manganese (Mn), aluminum (Al), zinc (Zn), copper (Cu), barium (Ba), titanium (Ti), tin (Sn), strontium (Sr), lead (P), boron (B), nitrogen (N), carbon (C), tungsten (W), chromium (Cr), bismuth (Bi), lithium (Li), yttrium (Y), and cadmium (Cd), or ferrite powders, but the present invention is not particularly limited thereto.

The Fe-based alloy may include at least one selected from the group consisting of a magnetic stainless steel (a Fe—Cr—Al—Si alloy), sendust (Fe—Si—Al alloy), Permalloy (a Fe—Ni alloy), silicon copper (a Fe—Cu—Si alloy), a Fe—Si alloy, a Fe—Si—B(—Cu—Nb) alloy, a Fe—Ni—Cr—Si alloy, a Fe—Si—Cr alloy, and a Fe—Si—Al—Ni—Cr alloy, but the present invention is not limited thereto. In this case, a Fe—Si—Cr alloy is preferably used.

Also, ferrite or pure iron particles may be used as the Fe-based alloy. An amorphous alloy (a Co-based, Fe-based or Ni-based alloy), a soft magnetic iron, and a Fe—Al-base alloy may be used as the Fe-based alloy. In this case, the Fe-based alloy may be an oxide, or may have an oxide structure at a moiety thereof. For example, the ferrite may be a soft ferrite such as Mn—Zn ferrite, Ni—Zn ferrite, Mn—Mg ferrite, Mn ferrite, Cu—Zn ferrite, and Cu—Mg—Zn ferrite, or a hard ferrite such as a permanent magnet material. A granular film may be used as the Co-based oxide (i.e., a Co—Zr—O-based or Co—Pb—Al—O-based oxide), and carbonyl iron particles may be used as the pure iron (Fe) particles.

The Fe-based alloy may include silicon (Si) at 1% by weight (wt %) to 16 wt %. When the content of the silicon (Si) is less than 1 wt %, thermal conductivity of the whole magnetic sheet may be degraded. On the other hand, when the content of the silicon (Si) is greater than 16 wt %, the thermal conductivity Ta in the width direction may be more degraded.

The base substrate according to the exemplary embodiment may further include a binder resin in addition to the magnetic powder. The binder resin included in the base substrate may be used without particular limitation as long as it is a binder that may be uniformly mixed with the particles of the magnetic powder and has a property of enabling the base substrate to form a thin film. In this case, the binder resin may include at least one selected from the group consisting of a polyvinyl alcohol-based resin, a silicon-based resin, an epoxy-based resin, an acrylate-based resin, a urethane-based resin, a polyamide-based resin, and a polyimide-based resin, but the present invention is not particularly limited thereto.

A blending ratio of the magnetic powder and the binder resin may be in a range of (70:30)~(95:5) (based on the weight). When the amount of the blended magnetic powder is too small, thermal conductivity may be degraded, and wireless charging performance of a final product may be degraded. On the other hand, when the amount of the blended magnetic powder is too high, processability may be degraded due to a relative decrease in the amount of the blended binder resin, durability of a magnetic sheet may be lowered although the magnetic powder is processed. Also, it may be difficult to expect the magnetic powder to have an effect of shielding an electromagnetic field due to an increase in the content of the magnetic powder. Therefore, the magnetic powder and the binder resin may be blended within this ratio range.

A conventional additive generally blended in the binder resin may be blended, and compatibility of the binder resin may be improved due to the addition of the additive. When the additive is blended, the content of the additive may be less than 2 wt %, based on the total weight of the composition. In this case, the additive may be a silane coupling agent, an antifoaming agent, a cross-linking agent, etc.

According to another aspect of this exemplary embodiment, there is provided a wirelessly charged magnetic member in which the two or more manufactured magnetic sheets are stacked.

Hereinafter, the manufacture of the wirelessly charged magnetic member according to this exemplary embodiment will be described with reference to methods according to preferred embodiments.

For example, the magnetic member of this exemplary embodiment may be manufactured as follows. A lamellar magnetic sheet may be manufactured using a base substrate composition including magnetic powder and a binder resin, and the two or more manufactured magnetic sheets may be stacked to manufacture the wirelessly charged magnetic member.

The lamellar magnetic sheet may be manufactured using methods known in the related art, for example, a method of directly forming a thin film on a substrate, a method of forming a thin film on a substrate by molding, etc.

An example of the method of directly forming a thin film on a substrate includes a method of depositing a base substrate composition onto a substrate using laser vapor deposition (LVD), physical vapor deposition (PVD), or chemical vapor deposition (PVD).

An example of the method of forming a thin film on a substrate by molding includes a method of forming a thin film from a base substrate composition by injection, extrusion, pressing, casting, blow molding, etc. Here, the use of a pressing method is preferred. When the pressing method is used, an orientation of the particles of the magnetic powder may be improved, and superior thermal conductivity may be obtained even when the magnetic powder is used at a low content.

The exemplary embodiments implement the magnetic sheet which includes a base substrate; and a binder resin and a plurality of particles of magnetic powder included in the base substrate, wherein the magnetic powder has a width-direction length X longer than a thickness-direction length Y of the base substrate. The thermal conductivity in the width direction can be improved when lamellar particles of the magnetic powder are oriented in a horizontal direction, and the magnetic sheet having both an electromagnetic field shielding function and a heat dissipating function can also be very effectively applied to wireless charging products.

Hereinafter, the present invention will be described in detail with reference to exemplary embodiments thereof. However, it should be understood that the description proposed herein is just a preferable example for the purpose of illustrations only, not intended to limit or define the scope of the invention.

Example 1

A Fe—Si—Cr alloy having an average particle size of 40 μm was mixed with a polyvinyl alcohol-based resin, and the resulting mixture was subjected to a pressing method to manufacture a magnetic sheet having an apparent density of 0.44 g/cm$^3$ and a thickness of 0.5 μm.

Example 2

A Fe—Si—Cr alloy having an average particle size of 35 μm was mixed with a polyvinyl alcohol-based resin, and the resulting mixture was subjected to a pressing method to manufacture a magnetic sheet having an apparent density of 0.48 g/cm$^3$ and a thickness of 0.8 μm.

Example 3

A Fe—Si—Cr alloy having an average particle size of 40 μm was mixed with a polyvinyl alcohol-based resin, and the resulting mixture was subjected to a pressing method to manufacture a magnetic sheet having an apparent density of 0.61 g/cm$^3$ and a thickness of 1.25 μm.

Example 4

A magnetic sheet including Si at 11 wt % was manufactured by mixing a Fe—Si—Cr alloy with a polyvinyl alcohol-based resin and subjecting the resulting mixture to a pressing method to manufacture a magnetic sheet.

Comparative Example 1

A magnetic sheet including Si at 12.06 wt % was manufactured by mixing a Fe—Si—Cr alloy with a polyvinyl alcohol-based resin and subjecting the resulting mixture to a pressing method to manufacture a magnetic sheet.

Experimental Example

1. Thermal Conductivity According to Compositions of Magnetic Powders

TABLE 1

|  | Example 1 | Example 2 | Example 3 |
|---|---|---|---|
| Apparent density (g/cm$^3$) | 0.44 | 0.48 | 0.80 |
| Average particle size (μm) | 40 | 35 | 40 |
| Average thickness (μm) | 0.5 | 0.8 | 1.25 |
| Specific surface area (m$^2$/g) | 2.60 | 1.63 | 1.04 |
| Thermal conductivity Tb in thickness direction | 0.44 W/m·k | 0.36 W/m·k | 0.43 W/m·k |
| Thermal conductivity Ta in width direction | 6.08 W/m·k | 4.1 W/m·k | 3.17 W/m·k |
| Thermal conductivity Ta in width direction/Thermal conductivity Tb in thickness direction | 13.8 | 11.4 | 7.4 |

The surface properties and thermal conductivities of the magnetic sheets prepared in Examples 1 to 3 are listed in Table 1. As listed in Table 1, it was revealed that the apparent density is proportional to the thickness of the magnetic powder, and the magnetic sheets have a high thermal conductivity since the specific surface area increased as the apparent density decreased, and the thermal conductivity Ta in the width direction increased.

2. Thermal Conductivity According to Si Content in Magnetic Powder

TABLE 2

|  | Thermal conductivity Tb in thickness direction | Thermal conductivity Ta in width direction |
|---|---|---|
| Example 4 | 0.46 W/m·k | 4.57 W/m·k |
| Comparative Example 1 | 0.36 W/m·k | 4.35 W/m·k |

The thermal conductivity Tb in the thickness direction and the thermal conductivity Ta in the width direction of the magnetic sheets prepared in Example 4 and Comparative Example 1 are listed in Table 2. As listed in Table 2, it was revealed that the magnetic sheets have a higher thermal conductivity when the content of Si is less than 16 wt %.

While the invention has been shown and described with reference to certain exemplary embodiments thereof, it will be understood by those skilled in the art that various changes in form and details may be made therein without departing from the spirit and scope of the invention as defined by the appended claims.

Industrial Applicability

What is claimed is:

1. A magnetic sheet comprising:
a thin film formed from a base substrate composition including a binder resin and a plurality of particles of Fe-based alloy magnetic powder having a width-direction length (X) longer than a thickness-direction length (Y),
wherein a proportion of the particles of the magnetic powder oriented to have an angle (θ) with respect to total number of the particles of the magnetic powder is in a range of 30%~99%, the angle being formed by an extension line of a cross section of each of the particles of the magnetic powder in a horizontal direction and an extension line of a horizontal plane of the base substrate wherein the angle is an acute angle, an obtuse angle or a straight angle,
wherein the plurality of particles of the magnetic powder in the base substrate has an apparent density of 0.2~0.8 g/cm$^3$,
wherein the magnetic sheet is configured such that the base substrate has a thermal conductivity (Ta) in the width direction greater than a thermal conductivity (Tb) in the thickness direction,
wherein a ratio (Ta:Tb) of the thermal conductivity (Ta) in the width direction and the thermal conductivity (Tb) in the thickness direction is in a range of (5~1.5):1,
wherein the thermal conductivity (Ta) in the width direction is in a range of 3 W/m·k to 10 W/m·k, and
wherein the Fe-based alloy comprises Si having a content by weight in a range of 1%-16%.

2. The magnetic sheet of claim 1, wherein the magnetic powder satisfies a relationship in which an angle formed between an extension line (X2) in the width-direction (X) of the particles of the magnetic powder and the extension line of the horizontal plane of the base substrate is in a range of 30° ~60° at a central point (X1) that is a center of the width-direction length (X) of the particles of the magnetic powder.

3. The magnetic sheet of claim 1, wherein the plurality of particles of the magnetic powder satisfies a relationship in which a ratio of the width-direction length (X) and the thickness-direction length (Y) is in a range of (3~80):1.

4. The magnetic sheet of claim 3, wherein an average width-direction length (X) of the particles of the magnetic powder is in a range of 10~100 μm.

5. The magnetic sheet of claim 1, wherein the binder resin comprises at least one selected from the group consisting of a polyvinyl alcohol-based resin, a silicon-based resin, an epoxy-based resin, an acrylate-based resin, a urethane-based resin, a polyamide-based resin, and a polyimide-based resin.

6. The magnetic sheet of claim 5, wherein a blending ratio of the magnetic powder and the binder resin is in a range of 70:30~95:5 (based on weight).

7. A wirelessly charged magnetic member comprising:
two or more stacked magnetic sheets,
wherein each of the magnetic sheets comprises a thin film formed from a base substrate composition including a binder resin and a plurality of particles of Fe-based alloy magnetic powder having a width-direction length (X) longer than a thickness-direction length (Y),
wherein a proportion of the particles of the magnetic powder oriented to have an angle (θ) with respect to total number of the particles of the magnetic powder is in a range of 30%~99%, the angle being formed by an extension line of a cross section of each of the particles of the magnetic powder in a horizontal direction and an extension line of a horizontal plane of the base substrate wherein the angle is an acute angle, an obtuse angle or a straight angle,
wherein the plurality of particles of the magnetic powder in the base substrate has an apparent density of 0.2~0.8 g/cm$^3$,
wherein the thermal conductivity (Ta) in the width direction is in a range of 3 W/m·k to 10 W/m·k,
wherein a ratio (Ta:Tb) of the thermal conductivity (Ta) in the width direction and the thermal conductivity (Tb) in the thickness direction is in a range of (5~15):1, and
wherein the Fe-based alloy comprises Si having a content by weight in a range of 1%-16%.

8. The wirelessly charged magnetic member of claim 7, wherein the magnetic powder satisfies a relationship in which the angle formed between an extension line (X2) in the width-direction (X) of the particles of the magnetic powder and the extension line of the horizontal plane of the base substrate is in a range of 30° ~60° at a central point (X1) that is a center of the width-direction length (X) of the particles of the magnetic powder.

9. The wirelessly charged magnetic member of claim 7, wherein an average width-direction length (X) of the particles of the magnetic powder is in a range of 10~100 μm, and
wherein the plurality of particles of the magnetic powder satisfies a relationship in which a ratio of the width-direction length (X) and the thickness-direction length (Y) is (3~80):1.

10. The wirelessly charged magnetic member of claim 7, wherein a blending ratio of the magnetic powder and the binder resin is in a range of 70:30~95:5 (based on weight).

* * * * *